(12) United States Patent  
Biemer et al.

(10) Patent No.: US 7,995,346 B2
(45) Date of Patent: Aug. 9, 2011

(54) RUGGEDIZED, SELF ALIGNING, SLIDING AIR SEAL FOR REMOVABLE ELECTRONIC UNITS

(75) Inventors: Michael G. Biemer, Sykesville, MD (US); Stephen C. Konsowski, Sykesville, MD (US); Tiffani Haas, Pikesville, MD (US); Jason Krywicki, Glen Burnie, MD (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 403 days.

(21) Appl. No.: 12/060,719

(22) Filed: Apr. 1, 2008

(65) Prior Publication Data

US 2009/0225510 A1 Sep. 10, 2009

Related U.S. Application Data

(60) Provisional application No. 61/034,300, filed on Mar. 6, 2008.

(51) Int. Cl.
*H05K 7/20* (2006.01)
*H05K 5/00* (2006.01)
*H05K 7/16* (2006.01)
*A47G 19/08* (2006.01)
*A47B 81/00* (2006.01)

(52) U.S. Cl. ... 361/726; 361/724; 361/752; 361/679.46; 361/756; 454/184; 312/223.2; 211/410.17

(58) Field of Classification Search .......... 361/724–726, 361/752, 756, 679.46; 454/184; 312/223.2; 211/41.17
See application file for complete search history.

(56) References Cited

U.S. PATENT DOCUMENTS

| 2,843,806 | A | | 7/1958 | O'Neill |
| 3,382,476 | A | * | 5/1968 | Novet ........................... 439/377 |
| 3,648,113 | A | * | 3/1972 | Rathjen et al. ................. 361/707 |
| 3,956,673 | A | | 5/1976 | Seid |
| 4,006,388 | A | | 2/1977 | Bartholomew |
| 4,171,859 | A | * | 10/1979 | Altoz et al. ...................... 439/61 |
| 4,277,815 | A | | 7/1981 | Skroupa |
| 4,375,290 | A | * | 3/1983 | Zucchi et al. ................. 277/608 |
| 4,393,437 | A | * | 7/1983 | Bell et al. ...................... 361/690 |
| 4,442,475 | A | | 4/1984 | Franklin |
| 4,538,675 | A | * | 9/1985 | Welsh ........................... 165/80.4 |
| 4,549,602 | A | * | 10/1985 | Espinoza ..................... 165/80.2 |
| 4,672,509 | A | * | 6/1987 | Speraw ..................... 361/679.49 |
| 4,736,274 | A | * | 4/1988 | Davies et al. ................. 361/756 |
| 4,935,845 | A | * | 6/1990 | Schwehr et al. ............... 361/694 |
| 5,034,852 | A | | 7/1991 | Rosenberg |
| 5,220,485 | A | * | 6/1993 | Chakrabarti ................. 361/720 |
| 5,410,448 | A | * | 4/1995 | Barker et al. ................. 361/695 |

(Continued)

*Primary Examiner* — Bradley Thomas
(74) *Attorney, Agent, or Firm* — Marsteller & Associates, P.C.

(57) ABSTRACT

An electronics housing system (S) adapted for electronic devices (D) includes a main chassis unit (M) and at least one removable module (10) mountable with the base unit (M) for supporting electronic circuitry components electro-optically coupled with the base unit (M). The removable module assembly (10) has a main body (12) that includes two opposing mounting edges (14, 16) and a connection edge (18). At least one of the mounting edges (14, 16) of the removable mounting assembly (10) has an opening (20) to receive a cooling air flow (F) into an interior cavity (22) of the main body (12) of the removable module (10). The main chassis (M) has a pair of opposing module mounting assemblies (24, 26) to receive a removable module (10) between the opposing module mounting assemblies (24, 26). The electronics rack wall (24, 26) includes a removable seal plate (32) to provide an air seal.

19 Claims, 4 Drawing Sheets

U.S. PATENT DOCUMENTS

| | | | | |
|---|---|---|---|---|
| 5,424,916 A * | 6/1995 | Martin | | 361/698 |
| 5,493,473 A * | 2/1996 | Yanagi | | 361/695 |
| 5,825,621 A * | 10/1998 | Giannatto et al. | | 361/701 |
| 5,828,556 A * | 10/1998 | Zenitani et al. | | 361/802 |
| 5,835,349 A * | 11/1998 | Giannatto et al. | | 361/701 |
| 5,892,658 A * | 4/1999 | Urda et al. | | 361/704 |
| 5,982,619 A * | 11/1999 | Giannatto et al. | | 361/701 |
| 6,047,836 A * | 4/2000 | Miles | | 211/41.17 |
| 6,064,575 A * | 5/2000 | Urda et al. | | 361/721 |
| 6,104,613 A * | 8/2000 | Urda et al. | | 361/704 |
| 6,212,075 B1 * | 4/2001 | Habing et al. | | 361/719 |
| 6,285,548 B1 * | 9/2001 | Hamlet et al. | | 361/695 |
| 6,305,180 B1 * | 10/2001 | Miller et al. | | 62/259.2 |
| 6,425,706 B1 * | 7/2002 | Jalanti et al. | | 403/381 |
| 6,765,798 B1 * | 7/2004 | Ratliff et al. | | 361/704 |
| 7,031,167 B1 * | 4/2006 | Zagoory et al. | | 361/759 |
| 7,180,737 B2 * | 2/2007 | Straub et al. | | 361/690 |
| 7,324,336 B2 * | 1/2008 | Vos et al. | | 361/694 |
| 2007/0253169 A1 * | 11/2007 | Clawser | | 361/720 |
| 2008/0019102 A1 * | 1/2008 | Yurko | | 361/719 |
| 2008/0186668 A1 * | 8/2008 | Naufel et al. | | 361/687 |
| 2009/0213543 A1 * | 8/2009 | Nemoz et al. | | 361/694 |

\* cited by examiner

RUGGEDIZED, SELF ALIGNING, SLIDING AIR SEAL FOR REMOVABLE ELECTRONIC UNITS

CROSS REFERENCE TO RELATED APPLICATIONS

This application claims the benefit of U.S. Provisional Application Ser. No. 61/034,300, filed Mar. 6, 2008, entitled RUGGEDIZED, SELF ALIGNING, SLIDING AIR SEAL FOR REMOVABLE ELECTRONIC UNITS.

BACKGROUND OF THE INVENTION

1. Technical Field

The invention relates to the field of air seals, and more particularly to an air seal and retention system between an equipment housing and a removable module to deliver cooling air across or through electrical components mounted with the removable module.

2. Background Art

High power dissipating electronic assemblies require cooling air to be directed through a compact heat exchanger. This usually consists of a pair of printed circuit boards which may be bonded, or more likely fastened together by means of a frame positioned between the two modules. It is necessary to provide a reliable seal at each end of these modules to prevent leakage of any cooling air between the electronics rack and the removable module. Such leakage can have drastic effect on the system's thermal performance and overall reliability.

It is desirable to have an air seal between an electronics rack and the removable electronics module that also provides a means to ensure low deflections during vibration through use of a fixed boundary condition. It is also desirable to have a sealing system which is resistant to jamming and misalignment and conducive to maintenance and repair. It is further preferred to have a sliding air seal which is cost effective and resistant to corrosive environmental conditions.

Known systems for air cooling of removable electronic units use an elastomeric seal which is vulcanized into a channel shaped guide. This has proven to be a difficult method to manufacture the seal. The present invention vulcanizes the resilient seal to a flat, tapered surface which reduces cost, tooling, and manufacturing complexity.

Known systems for air cooling of removable electronic units also use silicone as the material for the seals which are damaged by exposure to solvents and petro-chemical agents. The new invention uses a double layer of fluorosilicone material or other environmentally resistant material having two durometer values with one on top of the other, and enclosing the slotted opening that is coated with a low friction material on the upper elastomeric material to facilitate low sliding friction when an electronics module having a tapered surface is slid over and compresses the seal.

The known systems for air cooling of removable electronic units utilize difficult to manufacture airseals that are difficult to field replace and are not resistant to chemical environments. The seal of the present invention also has a novel retention method that uses a tab on the bottom (m) and only requires one fastener at the top allowing the seal to be easily field replaceable.

Historically, all airborne radar systems have used classic multiple stage vibration isolation systems to minimize undesirable motion to meet phase noise performance requirements, e.g., 3 stages for AWACS, APG-68, and B1-B. It has been shown that excessive motion during vibration has been determined to be the root cause of phase noise problems in legacy radar systems.

Advances in electronic component technology has resulted in stiffer, higher frequency module structures. (Stiffer means less displacement for a given input.) The development of a wedgelock for use on RF modules was launched in the early 1980's. Wedgelock technology has been part of the solution to high vibration environments and has been used successfully to restrain RF modules on all programs commencing with the APG-68 and B1-B radar systems.

Such sealing methods for printed circuit modules cooled by a flow of air include, for example, U.S. Pat. No. 4,375,290, issued Mar. 1, 1983 to Alfred A. Zucchi et al. Other examples for background purposes are U.S. Pat. Nos. 2,843,806, 3,956, 673, 4,006,388, and 4,277,815.

While the above cited references introduce and disclose a number of noteworthy advances and technological improvements within the art, none completely fulfills the specific objectives achieved by this invention.

DISCLOSURE OF INVENTION

In accordance with the present invention, an electronics housing system adapted for electronic devices includes a main chassis unit and at least one removable module mountable with the base unit for supporting electronic circuitry components electrically or electro-optically coupled with the base unit. The removable module assembly has a main body that includes two opposing mounting edges and an electrical connection edge along the bottom. Both of the vertical mounting edges of the removable mounting assembly or wall of the electronics rack have a slotted opening. One side acts to supply the cooling air flow into an interior cavity of the removable module assembly. The opposing side of the rack has an opening to receive the exhaust of the cooling air from the removable module.

The main chassis unit has a pair of separated and opposing module mounting assemblies or walls of the electronics rack adapted to receive and secure a removable module between the latter opposing module mounting assemblies or walls. Each wall of the electronics rack supporting the electronics module contains an air deliver plenum. One plenum is a pressurized supply for the cooling air and the opposite side wall of the chassis collects and expends the exhaust cooling air. The electronics rack further includes a removable seal plate member having a base plate for securing to the electronics rack and an affixed elastomeric and resilient seal member surrounding an opening formed through the base plate and extending from a surface of the base plate. The seal member then forms a sealing air dam or duct about the cooling air entry and exhaust slots communicated through the cooling air inlet slots of the electronics rack.

The module mounting assembly or wall of the electronics rack or main chassis housing also includes a pair of guide rails extending from the module mounting assembly or wall forming a U-shaped channel between the pair of guide rails for receiving one of the mounting edges of the removable module assembly.

The guide system of the present invention has two surfaces extending beyond the sealing surface of the electronics module providing protection for that sealing surface from objects that could damage the surface. These extensions provide a physical stop that prevents large objects from striking the sealing surface. In addition, the guides are extended so that they are a constant distance from the electronics module thus reducing the "rocking" that jammed the prior known sealing methods for printed circuit modules cooled by a flow of air.

The present invention reduces the frequency of failed installation of the module into the rack with the improved guide system. The present invention further improves the life expectancy of the module connector with the addition of a wedgelock to provide a fixed boundary condition at the module-rack interface. The air seal occupies less volume thus allowing for smaller rack designs. The fluorosilicone seal as described is also resistant to a broader range of petrochemicals and solvents.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

MODE(S) FOR CARRYING OUT THE INVENTION

Figure 1:
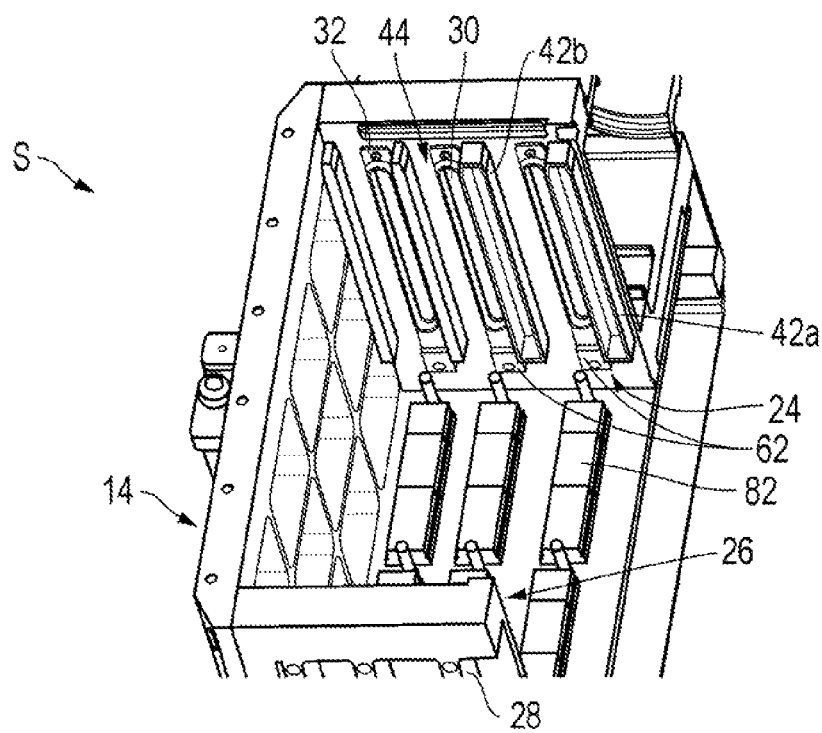
FIG. 1 is a perspective view of the interior of the main chassis unit of the housing assembly with no removable modules installed.
Figure 2:
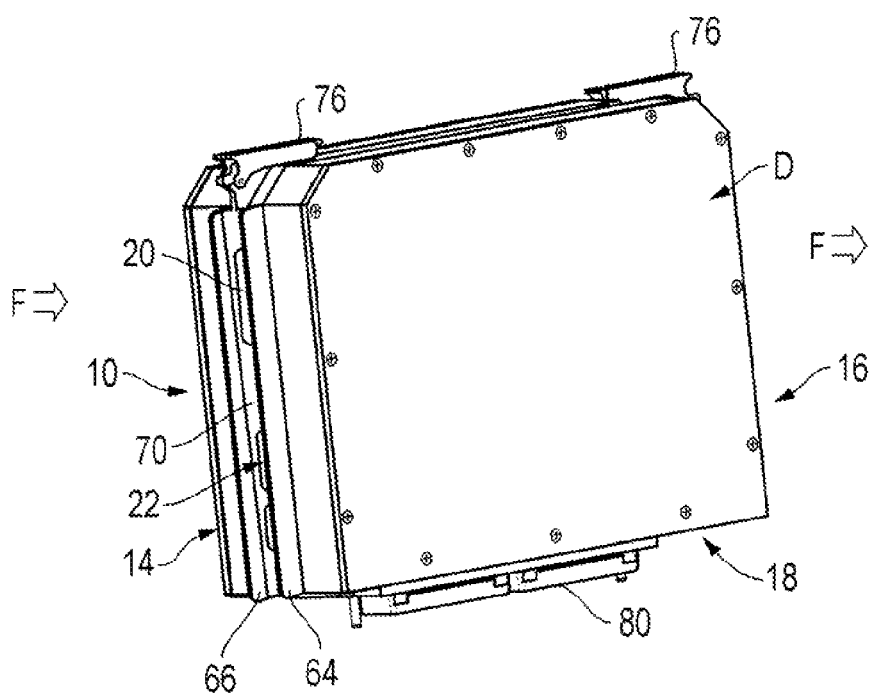
FIG. 2 is a left frontal elevational view of a removable module.
Figure 3:
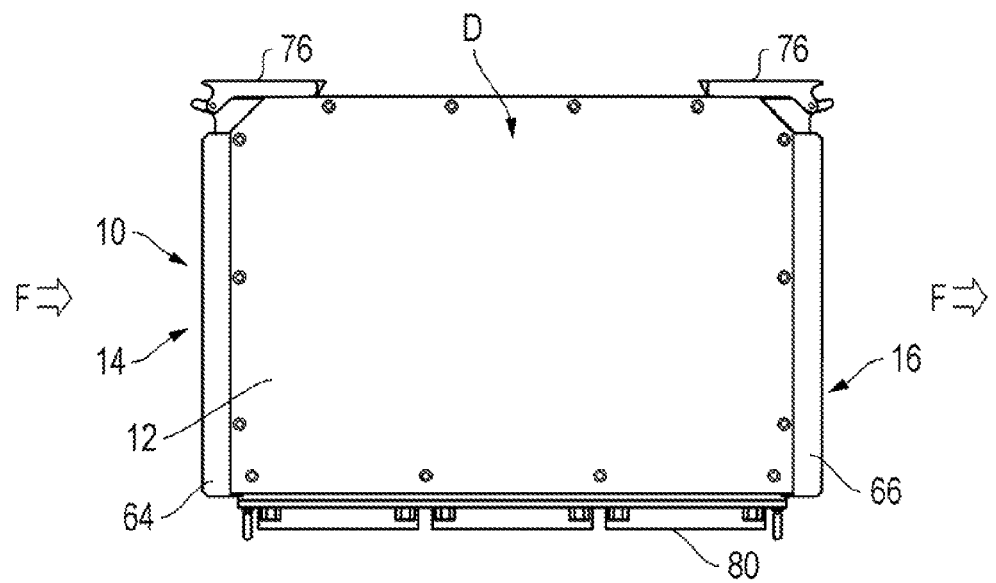
FIG. 3 is a left side elevational view of the removable module of FIG. 2.
Figure 4:
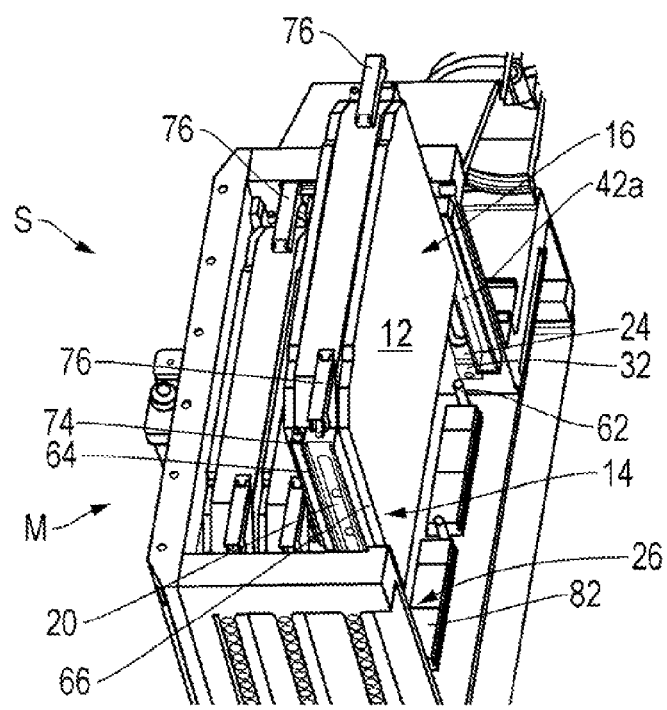
FIG. 4 is a perspective view of the interior of the main chassis with one removable module being positioned.
Figure 5:
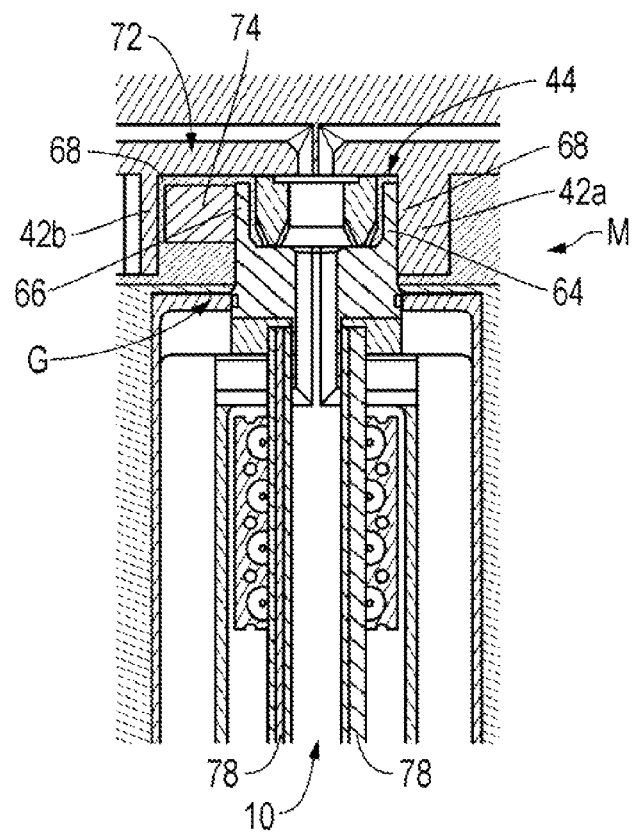
FIG. 5 is a cross-sectional view of a removable module installed into an electronic chassis.
Figure 6:
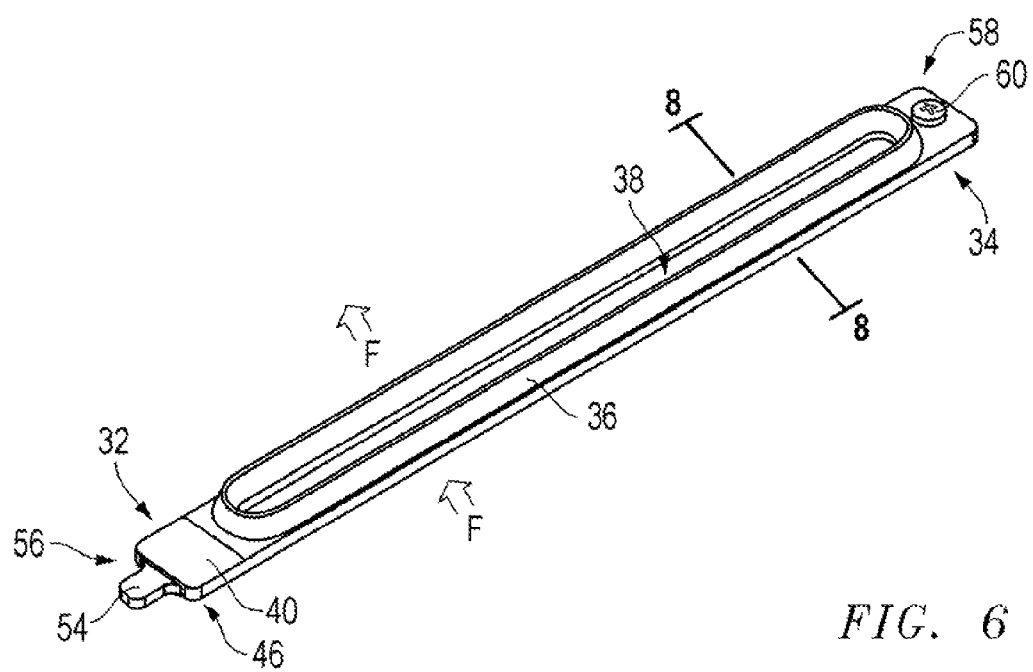
FIG. 6 is a perspective view of the seal plate member of the present invention.
Figure 7:
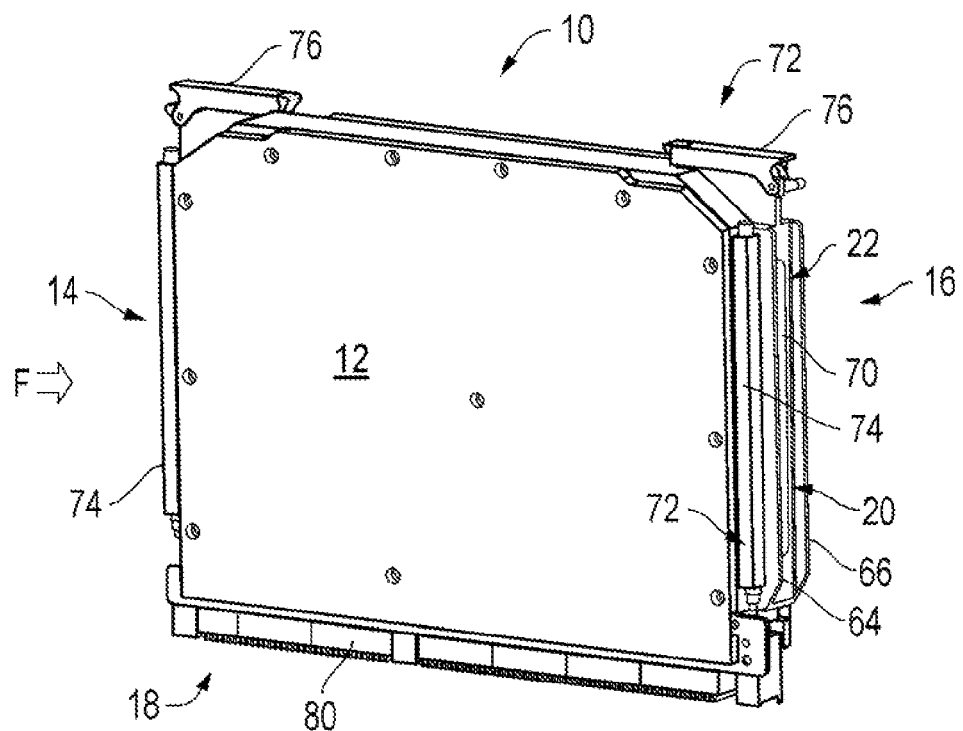
FIG. 7 is a right frontal elevational view of a removable module having a wedgelock type of latching mechanism.

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

An electronics housing system S adapted for electronic devices D, such as radios, radars, transmitters, and the like, includes a main chassis unit or electronics rack M and at least one compatible and controllably removable module assembly 10 mountable with the base unit or electronic rack M for supporting electronic circuitry components, such as a printed circuit board 78, electrically or electro-optically coupled with the base unit M with cooperating connectors 80 and 82.

The removable module assembly 10 has a main body 12 that generally includes two opposing, vertical mounting edges 14, 16 and a connection edge 18. At least one of the mounting edges 14, 16 of the removable mounting assembly 10 has an opening 20 to vent by receiving or passing a cooling air flow F into or from an interior cavity 22 of the main body 12 of the removable module assembly 10. The cooling air flow F is to flow across the electronic circuitry within the removable module assembly 10 and provide a cooling environment. The air flow F can exit the interior of the removable module assembly 10 either through a portion of the opening 20 if there is a U-shaped air flow path within the module 10 or else be vented through another opening in an opposite mounting edge 16 or other vents formed in the main body 12 of the module 10.

The electronic rack or main chassis unit M has at least one and preferably a pair of separated and opposing module mounting assemblies or walls 24, 26 adapted to receive and secure a compatible removable module 10 with a single module mounting assembly or wall 24 or between the opposing module mounting assemblies or walls 24, 26. At least one of the pair of the opposing module mounting assemblies or walls 24, 26 of the electronics rack M includes a plenum means 28 having an opening 30 for communicating the cooling air flow F to provide a cooling environment for the electronics contained within the removable module 10.

The module mounting wall or assembly 24, 26 of the main chassis unit M further includes a removable seal plate member 32 having a base plate 34 for securing to the module mounting wall or assembly 24, 26 and an affixed elastomeric and resilient seal member 36 surrounding an opening 38 formed through the base plate 34 and extending from a surface 40 of the base plate 34. The seal member or rubber bellows 36 forms a sealing air dam or duct about the cooling air flow F communicated through the plenum 28 of the module mounting assembly 24, 26.

The module mounting assembly 24, 26 also includes a pair of guide rails 42a, 42b extending from the module mounting assembly 24, 26 forming a U-shaped channel 44 between the pair of guide rails 42a, 42b for receiving one of the mounting edges 64, 66 of the removable module assembly 10. The U-shaped channel 44 is preferably sized to be compatible for receiving the corresponding mounting edge 64, 66 of the module 10.

Figure 8:
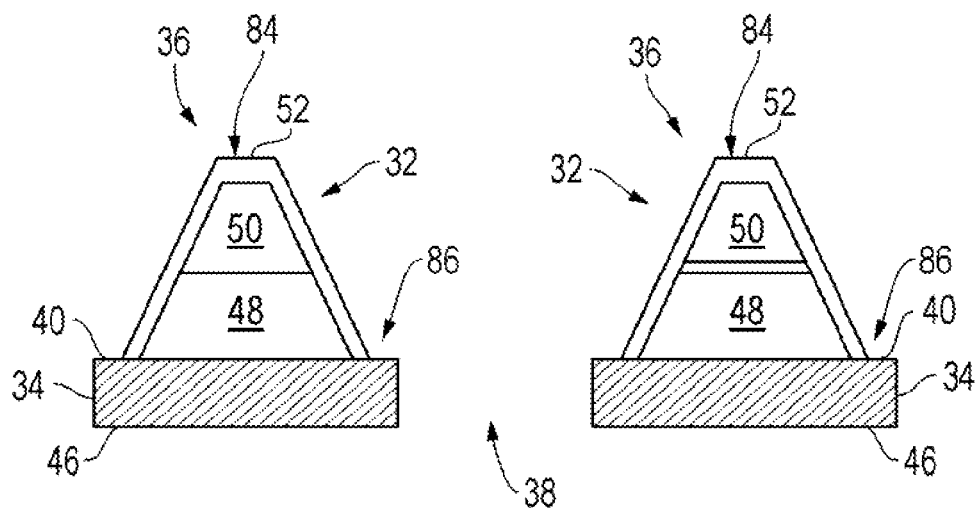
FIG. 8 is a cross-sectional view taken along line 8-8 in FIG. 6.

The sliding air seals 36 must work under a variety of conditions. The air seals 36 must operate in a wide variety of temperatures and exposure to corrosive materials. They also must resist tearing when the electronics module 10 is installed and not fail under compressive loads. The optionally removable seal plate member 32 incorporates a metal base plate 34 having a slot opening 38 for the air passage F down the center and an inclined upper surface 40 with respect to a lower surface 46; a double layer of elastomeric material 48, 50 having two durometer values, layered one on top of the other, that may be either fully or partially coated with a low friction material 52, such as Teflon® or the like, on at least a portion of the upper elastomeric material 50 to facilitate low friction when an electronics module 10 having a mating tapered surface 70 is slid over and compresses the seal 36. In a preferred embodiment of the slidable seal 36, the elastomeric material 48, 50 is formed having a tapered cross-section as shown in FIG. 8 with the top of the seal 84 in cross section being narrower than the base of the seal 86, and the sides in cross section sloping from the seal top 84 toward the wider seal base 86.

The rubber bellows or air seal member 36 may be vulcanized to the metal frame or plate member 34.

The known cooling systems for removable electronic units 10 also use silicone as the material for the seals that can be damaged by exposure to solvents and petro-chemical agents.

The present invention addresses this shortcoming by using new materials, such as a double layer of fluorosilicone material or other environmentally resistant material having two durometer values, and the removable design to facilitate ease of manufacture.

Known systems use a combined seal and module guide which results in a part which is difficult to manufacture and replace in the field. However, the present invention places the guide rails on the module and makes the seal much easier to fabricate and replace (if needed).

In a preferred embodiment of the seal plate member 32, the seal plate member 34 is preferably removable and includes a mounting tongue or tang 54 at one end 56 and having an opposing end 58 adapted to be secured to the compatible module mounting assembly 24, 26 with a removable fastener 60, such as a screw or other known fastening means cooperating with the module mounting assembly 24, 26, and the module mounting assembly 24, 26 includes a receptacle 62 adapted to receive the finger 54 of the removable seal plate member 34.

The known cooling systems for removable electronic units having air flow through electronics modules 10 do not provide a fixed boundary condition at the rack/module interface. The lack of this condition may cause excessive motion of the module 10 during vibration. This motion can produce fretting corrosion at the module-to-rack connector interface as well as electrical noise in sensitive electronics.

Generally, the vibration in the removable module 10 originates externally to the chassis M such as when the device D is mounted within an aircraft. The vibration is transmitted into the chassis M that then mechanically conveys the vibration into a mounted or connected module 10.

In addition, the known electronics module designs include a wedge shaped sealing surface, one that is wider at the top and narrower at the bottom near the connector interface at the connector edge 18. This taper causes misalignment and jamming of the module 10 in the rack M during installation. This condition can cause physical damage to the air seal and module sealing surface.

The present invention is a combined air seal, guide system, and retention method for containing cooling air between equipment racks M and electronics modules 10. The guide system on the electronics module provides alignment between the electronics rack or chassis M and the electronic module 10 and provides protection of the sealing surfaces on the electronics module 10. The guide system G is accomplished by positioning preferably two ribs 64, 66 on the module 10 to flank the air seal 36 which is installed in the electronics rack or main chassis M.

The electronics rack or main chassis housing M also contains guide rails 42a, 42b to align the module M and provide a clamping surface 68. The module ribs 64, 66 are designed to be a constant distance from the rack M which reduces the misalignment that is present in the known systems for cooling removable electronic units 10 that use a tapered surface. The ribs 64, 66 also protrude beyond the module 10 sealing surface 70 thus protecting the surface 70 from objects that could damage the surface 70.

The retention or latching mechanism 72 for the module 10 within the main chassis M is accomplished by using a wedge-lock or latch mechanism 74. The wedgelock 74 is tightened using the fastener or lever arm 76 at the top of the removable module 10. It thus provides a fixed structural boundary condition at the compatible and corresponding module-rack interface 24, 26 by clamping the module 10 to the rack or chassis M. The fixed boundary condition provides a robust design for use in high vibration applications by preventing motion of the electronics module 10 that could compromise connector interface or the air seal integrity.

The wedgelock type 74 of latching or locking mechanism 72 minimizes undesirable motion in the removable module 10 caused by vibration. RF modules 10 require stiff structures and fixed boundary interface conditions. For plug-in modules 10, wedgelocks 74 historically have provided the best option for achieving minimal motion during dynamic conditions.

In an alternative embodiment the connection edge 18 and the electro-optical connector or plug 80 can be formed or merged with one of the mounting edges 14, 16. I such an arrangement the interconnecting plug 80 may also function as one of the ribs 64, 66.

Vibration within an electronic device D of the type including a main chassis unit or electronics rack M and at least one compatible and removable module assembly 10 mountable with the main chassis unit M for supporting electronic circuitry components 78 electro-optically coupled with the main chassis unit M and the removable module assembly 10 that is being cooled by a cooling air flow F from the main chassis unit M about the electronic circuitry 78 can be reduced by mounting of attaching the removable module assembly 10 to at least one module mounting assembly 24 or else preferably between a pair of separated and opposing module mounting assemblies 24, 26 of the main chassis unit M. Alternatively, the removable module assembly 10 is ruggedized by the present invention to increase the natural frequency of the removable module 10.

The removable module assembly 10 has a main body 12 that generally includes two opposing mounting edges 14, 16 and a connection edge 18 as described above. At least one of the mounting edges 14, 16 of the removable mounting assembly 10 includes an opening 20 or other means to vent the cooling air flow F into an interior cavity 22 of the main body or housing 12 of the removable module assembly 10 from the main chassis unit M.

At least one of the preferred pair of the opposing module mounting assemblies 24, 26 includes a plenum means 28 having an opening 30 for communicating the cooling air flow F into the module 10. The module mounting assembly 24, 26 of the main chassis unit or electronics rack M further includes a seal plate member 32 that is preferably removable having a base plate 34 for securing to the module mounting assembly 24 of the main chassis unit M and an affixed elastomeric and resilient seal member 36 that is surrounding an opening 38 formed through the base plate 34 and extending from a surface 40 of the base plate 38. The seal member 32 forms a sealing air dam about the cooling air flow F communicated through the plenum 28 of the module mounting assembly 24 of the main chassis unit M.

The module mounting assembly 24 of the main chassis unit M also includes a pair of guide rails 42a, 42b extending from the module mounting assembly 24 of the main chassis unit M forming a U-shaped channel 44 between the pair of guide rails 42a, 42b for receiving one of the mounting edges 14, 16 of the removable module assembly 10. One of the mounting edges 14, 16 of the removable module assembly 10 is positioned within the compatibly formed U-shaped channel 44. The mounting edge so positioned is then placed or maneuvered into contact with a top or upper surface 84 of the compressible and resilient seal 32 to form a sealed passageway or channel between the plenum 28 and the opening 20 for the air flow F to pass through from the electronics rack member M to the interior 22 of the module 10.

The removable module assembly 10 further preferably includes latch means 72 for securing the removable module assembly 10 to the module mounting assembly 24 of the main chassis unit or electronics rack M. The removable module assembly 10 is then secured using the latch means 72 to a corresponding module mounting assembly 24 by locking one of the mounting edges of the removable module assembly 10 within the U-shaped channel 44.

In such a series of steps, vibration in the removable mounting assembly 10 caused by the cooling air flow F is reduced.

Further, reducing motion enhances radar system phase noise performance during airborne operation The foregoing disclosure and description of the invention are illustrative and explanatory thereof, and various changes in the size, shape and materials, as well as in the details of the illustrated construction may be made without departing from the spirit of the invention.

The invention claimed is:

1. An electronics housing system adapted for electronic devices of the type including a main chassis unit and at least one removable module assembly mountable within the main chassis unit for supporting electronic circuitry components electro-optically coupled with the main chassis unit, the invention comprising:

the removable module assembly having a main body including two opposing mounting edges and a connection edge; at least one of the mounting edges of the removable mounting assembly including an opening to vent a cooling air flow into an interior cavity of the main body of the removable module assembly from the main chassis unit;

the main chassis unit having a pair of separated and opposing module mounting assemblies adapted to receive and secure the removable module assembly between the opposing module mounting assemblies; at least one of the pair of the opposing module mounting assemblies including a plenum means having an opening for communicating the cooling air flow into the removable module assembly;

the at least one of the pair of module mounting assemblies of the main chassis unit further including a seal plate member having a base plate for securing to the at least one of the pair of module mounting assemblies of the main chassis unit and an affixed elastomeric and resilient seal member surrounding an opening formed through the base plate and extending from a surface of the base plate, the seal member forming a sealing air dam about the cooling air flow communicated through the plenum means of the at least one of the pair of module mounting assemblies of the main chassis unit;

the at least one of the pair of module mounting assemblies of the main chassis unit including a pair of guide rails extending from the at least one of the pair of module mounting assemblies of the main chassis unit forming a U-shaped channel between the pair of guide rails for receiving at least one of the mounting edges of the removable module assembly;

at least one of the mounting edges of the removable module assembly further includes at least one cooperating guide rail to protect a sealing surface from damage and is adapted to abut against one of the mating guide rails extending from the at least one of the pair of module mounting assemblies of the main chassis unit when the removable module assembly is mounted within the main chassis unit; and, the removable module assembly further includes latch means for clamping the at least one cooperating guide rail of the removable module assembly to at least one of the guide rails of the at least one of the pair of module mounting assemblies of the main chassis unit for providing a fixed structural boundary condition between the removable module assembly and the main chassis unit.

2. The invention of claim 1 wherein the latch means for securing the removable module assembly to the at least one of the pair of module mounting assemblies of the main chassis unit includes a wedgelock type clamping device.

3. The invention of claim 1 wherein the elastomeric seal member is formed from dual durometer elastomeric material.

4. The invention of claim 3 wherein the elastomeric seal member includes an outer coating formed from a friction reducing material.

5. The invention of claim 1 wherein the elastomeric seal member is formed having a tapered cross section from a top surface to a wider base.

6. The invention of claim 1 wherein the base plate of the seal plate member is formed having an inclined upper surface with respect to a lower surface.

7. The invention of claim 1 wherein the seal plate member is removable and includes a mounting finger at one end and having an opposing end adapted to be secured to at least one of the pair of module mounting assemblies of the main chassis unit with a removable fastener, and the at least one of the pair of module mounting assemblies of the main chassis unit includes a receptacle adapted to receive the finger of the removable seal plate member.

8. An electronics main chassis unit adapted for electronic devices of the type for receiving at least one removable module assembly for supporting electronic circuitry components electro-optically coupled within the main chassis unit, the invention comprising:

the main chassis unit having a pair of separated and opposing module mounting assemblies adapted to receive and secure a removable module assembly between the opposing module mounting assemblies; at least one of the pair of the opposing module mounting assemblies including a plenum means having an opening for communicating the cooling air flow into the removable module assembly;

the at least one of the pair of module mounting assemblies of the main chassis unit further including a removable seal plate member having a base plate for securing to the at least one of the pair of module mounting assemblies of the main chassis unit and an affixed elastomeric and resilient seal member surrounding an opening formed through the base plate and extending from a surface of the base plate, the seal member forming a sealing air dam about the cooling air flow communicated through the plenum means of the at least one of the pair of module mounting assemblies of the main chassis unit;

the at least one of the pair of module mounting assemblies of the main chassis unit including a pair of guide rails extending from the module mounting assembly of the main chassis unit forming a U-shaped channel between the pair of guide rails for receiving a mounting edge of the removable module assembly;

at least one of the mounting edges of the removable module assembly further includes at least one cooperating guide rail to protect a sealing surface from damage and is adapted to abut against one of the mating guide rails extending from the at least one of the pair of module mounting assemblies of the main chassis unit when the removable module assembly is mounted within the main chassis unit; and, the removable module assembly further includes latch means for clamping the at least one cooperating guide rail of the removable module assembly to at least one of the guide rails of the at least one of the pair of module mounting assemblies of the main chassis unit for providing a fixed structural boundary condition between the removable module assembly and the main chassis unit.

9. The invention of claim 8 wherein the latch means for securing the removable module assembly to the at least one of the pair of module mounting assemblies of the main chassis unit includes a wedgelock type clamping device.

10. The invention of claim 8 wherein the elastomeric seal member is formed from dual durometer elastomeric material.

11. The invention of claim 10 wherein the elastomeric seal member includes an outer coating formed from a friction reducing material.

12. The invention of claim 8 wherein the elastomeric seal member is formed having a tapered cross section from a top surface to a wider base.

13. The invention of claim 8 wherein the base plate of the seal plate member is formed having an inclined upper surface with respect to a lower surface.

14. The invention of claim 8 wherein the seal plate member is removable and includes a mounting finger at one end and having an opposing end adapted to be secured to a at least one of the pair of module mounting assemblies of the main chassis unit with a removable fastener, and the module mounting assembly of the main chassis unit includes a receptacle adapted to receive the finger of the removable seal plate member.

15. The method of claim 14 wherein the latch means for securing the removable module assembly to the at least one of the pair of module mounting assemblies of the main chassis unit includes a wedgelock type clamping device.

16. A method for reducing vibration within an electronic device of the type including a main chassis unit and at least one removable module assembly mountable with the main chassis unit for supporting electronic circuitry components electro-optically coupled within the main chassis unit and the removable module assembly being cooled by a cooling air flow from the main chassis unit about the electronic circuitry, the invention comprising:

mounting the removable module assembly to at least one module mounting assembly of the main chassis unit;

the removable module assembly having a main body including two opposing mounting edges and a connection edge; at least one of the mounting edges of the removable module mounting assembly including an opening to vent the cooling air flow into an interior cavity of the main body of the removable module assembly from the main chassis unit;

the at least one of the pair of module mounting assemblies to which the removable module assembly is mounted including a plenum means having an opening for communicating the cooling air flow into the removable module assembly;

the at least one of the pair of module mounting assemblies of the main chassis unit further including a seal plate member having a base plate for securing to the at least one of the pair of module mounting assemblies of the main chassis unit and an affixed elastomeric and resilient seal member surrounding an opening formed through the base plate and extending from a surface of the base plate, the seal member forming a sealing air dam about the cooling air flow communicated through the plenum means of the at least one of the pair of module mounting assemblies of the main chassis unit;

the at least one of the pair of module mounting assemblies of the main chassis unit including a pair of guide rails extending from the at least one of the pair of module mounting assemblies of the main chassis unit forming a U-shaped channel between the pair of guide rails for receiving one of the mounting edges of the removable module assembly;

the removable module assembly further includes latch means for securing the removable module assembly to the at least one of the pair of module mounting assemblies of the main chassis unit;

at least one of the mounting edges of the removable module assembly further includes at least one cooperating guide rail to protect a sealing surface from damage and is adapted to abut against one of the mating guide rails extending from the at least of the pair of module mounting assemblies of the main chassis unit when the removable module assembly is mounted within the main chassis unit; and, positioning one of the mounting edges of the removable module assembly within the U-shaped channel; and, securing the removable module assembly with the latch means to the corresponding at least one of the pair of module mounting assemblies by clamping the at least one cooperating guide rail of the removable module assembly to at least one of the guide rails of the at least one of the pair of module mounting assemblies of the main chassis unit for providing a fixed structural boundary condition between the removable module assembly and the main chassis unit;

whereby vibration in the removable mounting assembly is reduced.

17. The method of claim 16 wherein the elastomeric seal member is formed from dual durometer elastomeric material.

18. The method of claim 17 wherein the elastomeric seal member includes an outer coating formed from a friction reducing material.

19. The method of claim 16 wherein the removable seal plate member includes a mounting finger at one end and having an opposing end adapted to be secured to a at least one of the pair of module mounting assemblies of the main chassis unit with a removable fastener, and the at least one of the pair of module mounting assemblies of the main chassis unit includes a receptacle adapted to receive the finger of the removable seal plate member.

* * * * *